United States Patent [19]

Seitz et al.

[11] Patent Number: 4,513,278

[45] Date of Patent: Apr. 23, 1985

[54] VIDEO SYNTHESIZER FOR A DIGITAL VIDEO DISPLAY SYSTEM EMPLOYING A PLURALITY OF GRAYSCALE LEVELS DISPLAYED IN DISCRETE STEPS OF LUMINANCE

[75] Inventors: Charles L. Seitz, San Luis Rey, Calif.; Paul Grunewald, Flemington, N.J.; Marshall M. Parker, San Diego; Irvin G. Stafford, Carlsbad, both of Calif.

[73] Assignee: Burroughs Corporation, Detroit, Mich.

[21] Appl. No.: 82,565

[22] Filed: Oct. 9, 1979

Related U.S. Application Data

[63] Continuation of Ser. No. 836,842, Sep. 26, 1977.

[51] Int. Cl.[3] .......... H03K 13/02

[52] U.S. Cl. .......... 340/347 DA; 315/367; 315/383; 340/347 CC; 340/347 M; 328/144; 358/32; 358/164

[58] Field of Search .......... 340/347 M, 347 DA; 358/32, 33, 138, 164; 315/31 TV, 52, 367, 383, 384; 307/251; 328/144

[56] References Cited

U.S. PATENT DOCUMENTS

| | | | |
|---|---|---|---|
| 3,217,147 | 11/1965 | Chapman | 340/347 DA |
| 3,508,249 | 4/1970 | Gordon | 340/347 M X |
| 3,541,354 | 11/1970 | Basham | 307/251 |
| 3,573,795 | 4/1971 | Bowers et al. | 340/347 DA |
| 3,576,561 | 4/1971 | Dureau et al. | 340/347 DA |
| 3,705,359 | 12/1972 | Kappes | 340/347 AD X |
| 3,852,640 | 12/1974 | McCarthy | 315/367 X |
| 3,872,348 | 3/1975 | Astley | 315/384 X |
| 4,015,079 | 3/1977 | Satou et al. | 358/164 |
| 4,016,555 | 4/1977 | Tyrrel | 340/347 DA |
| 4,029,949 | 6/1977 | Dew | 340/347 DA |
| 4,057,836 | 11/1977 | Munsey | 358/138 X |

OTHER PUBLICATIONS

Grob, Basic Television, McGraw-Hill Book Company, Inc., 1954, pp. 64–67, 84 and 85.

*Primary Examiner*—T. J. Sloyan
*Attorney, Agent, or Firm*—Charles J. Fassbender; Mervyn L. Young; Kevin R. Peterson

[57] ABSTRACT

A digital video display system wherein the various characters to be displayed are displayed in the form of images of the complete character rather than the standard dot-matrix pattern of the prior art. A character generator in the display system stores signals representing the various characters to be displayed which are retrieved from storage in response to a character code. The signals are in the form of a binary code having a sufficient number of bits to represent a different number of levels of gray-scale or luminance values for the various picture elements making up the character image. The binary codes thus retrieved from storage are supplied to a video synthesizer that generates the video signal to display the character images which may be displayed in a number of different modes including white-on-black, black-on-white, black-on-gray, and white-on-gray as well as different combinations of such modes to represent a cursor. The video synthesizer can generate output voltage levels in discrete steps for the different luminances to be employed. The voltage output signals differ from level to level in accordance with the 2.2 root of luminance.

5 Claims, 14 Drawing Figures

| | | | | |
|---|---|---|---|---|
| 0 | 1 | 7 | 1 | 0 |
| 0 | 3 | 7 | 3 | 0 |
| 0 | 5 | 6 | 5 | 0 |
| 0 | 7 | 2 | 7 | 0 |
| 2 | 7 | 5 | 7 | 2 |
| 4 | 5 | 3 | 5 | 4 |
| 6 | 1 | 0 | 1 | 6 |

| CHARACTER DATA | MODE, CURSOR | | | | | | | |
|---|---|---|---|---|---|---|---|---|
| | WHITE-ON-BLACK | | BLACK-ON-WHITE | | BLACK-ON-GREY | | WHITE-ON-GREY | |
| | 00 0 | 00 1 | 01 0 | 01 1 | 10 0 | 10 1 | 11 0 | 11 1 |
| 0 | 0 | 7 | 14 | 7 | 7 | 14 | 7 | 0 |
| 1 | 2 | 8 | 12 | 6 | 6 | 12 | 8 | 2 |
| 2 | 4 | 9 | 10 | 5 | 5 | 10 | 9 | 4 |
| 3 | 6 | 10 | 8 | 4 | 4 | 8 | 10 | 6 |
| 4 | 8 | 11 | 6 | 3 | 3 | 6 | 11 | 8 |
| 5 | 10 | 12 | 4 | 2 | 2 | 4 | 12 | 10 |
| 6 | 12 | 13 | 2 | 1 | 1 | 2 | 13 | 12 |
| 7 | 14 | 14 | 0 | 0 | 0 | 0 | 14 | 14 |

OUTPUT DATA

FIG. 7

VIDEO SYNTHESIZER FOR A DIGITAL VIDEO DISPLAY SYSTEM EMPLOYING A PLURALITY OF GRAYSCALE LEVELS DISPLAYED IN DISCRETE STEPS OF LUMINANCE

This is a continuation of application Ser. No. 836,842, filed Sept. 26, 1977.

RELATED U.S. PATENT APPLICATIONS

U.S. patent applications directly or indirectly related to the subject application are as follows:

Ser. No. 836,746, filed Sept. 26, 1977 U.S. Pat. No. 4,158,200, by C. L. Seitz et al, and entitled "Digital Video Display System with a Plurality of Gray-Scale Levels"; and Ser. No. 079,831, filed Sept. 28, 1979 U.S. Pat. No. 4,284,988, by C. L. Seitz et al, and entitled "Control Means to Provide Slow Scrolling, Positioning and Spacing in a Digital Video Display System.

BACKGROUND OF THE INVENTION

1. Field of the Invention

This invention relates to a digital video display system and more particularly to such a display system having a video synthesizer providing a plurality of grayscale levels for a more natural display of characters.

2. Description of the Prior Art

There are commercially available today many examples of so called "video character displays" or "video terminals". These systems form representations of characters on the face of a cathode ray tube where each character is formed as a matrix of discrete points. Such a method of representation of characters predates electronics and may be found in embroidery, mosaics, and other disciplines employing a grid pattern. Such characters displayed on a cathode ray tube are of inferior readability unless the dot matrix allowed for each character is much larger than 5×7 or 7×9 which are the most commonly used matrices. Larger matrices require the electron beam to transverse many more points on each complete display fram, and thus require higher speed logic and cathode ray tube deflection circuits.

Although such systems may be called "video terminals", they are without exception incompatible with broadcast video standards and use a standard television set or monitor in such a crude fashion that half of its spatial and all of its gray-scale resolution is lost in forming an image.

The most important reason why designers have avoided the standard broadcast type of video raster is that it is interlaced. By producing the complete frame with two interlaced fields, broadcast video achieves twice the vertical resolution than can be achieved at that scan rate without interlace. However, dot-matrix characters appear to "flicker" when interlaced fields are used, particularly if the great majority of dots over any local region happen to fall within one or the other field. Flicker is a problem when interlace is employed not only for dot-matrix characters but also when there are very high contrast images. Thus, even when a standard video monitor is employed as the display device for a video terminal, it is used without interlace and is limited in its vertical resolution. Because this resolution is inadequate to display a large number of good quality dot-matrix characters, some systems must employ video rasters which are incompatible with standard video monitors. It is desirable to employ standard video monitors because of their economy due to mass production.

Such dot-matrix raster scan video displays are disclosed for example in the Cole U.S. Pat. No. 3,345,458. However, the concept of dot-matrix character generation for video display goes back to 1948 as evidence by the Dirks U.S. Pat. No. 2,972,016.

It is, then, an object of the present invention to provide a digital video display system which provides more natural display of characters and other information.

It is another object of the present invention to provide a digital video display system having interlaced scan for higher resolution but which display is "flicker" free.

It is still another object of the present invention to provide a video digital display system that can employ standard commercial video monitors.

SUMMARY OF THE INVENTION

In order to achieve the above-described objects, the present invention resides in a video synthesizer for a digital video system that displays a full image of a character by employing different levels of gray-scale or luminance representing the character image. The video snythesizer is adapted to generate signals representing the different character images in a number of different display modes including white-on-black, black-on-white, black-on-gray, and white-on-gray as well as different combinations of such modes to represent a cursor. The video synthesizer includes the storage device to receive the luminance code and to map that code into a unary or monadic operation code representing a plurality of different luminance levels, the unary code being employed to drive a resistance network to generate the video signals. The discrete steps represented by the unary code cause the resistance network to generate discrete voltage output signals which differ from level to level in accordance with the 2.2 root of luminance.

A feature then of the present invention resides in a video synthesizer for a digital video display which includes means to map an image luminance value into a unary code and an analog voltage generator which is responsive to the unary code to produce discrete output voltage levels, the mapping means being adapted to provide different unary codes representing different display modes.

BRIEF DESCRIPTION OF THE DRAWINGS

The above and other objects, advantages and features of the present invention will become more readily apparent from a review of the following specification when taken in conjunction with the drawings, wherein:

FIG. 7 is an example of character data mapping as employed in the present invention;

GENERAL DESCRIPTION OF THE SYSTEM

For video representation of an image, a signal must be provided which produces on a video monitor an approximation of that image which is close enough to what is preceived by the human eye. A video camera will convert the image to a signal for the display of natural scenes. For synthetic images, such as character or graphic displays, a synthetic video signal is produced electronically according to information stored within or delivered to the electronic system.

The usual analog video art requires that two discrete approximations be made to present an approximation to a natural scene. The scene is composed of a sequence of discrete frames and each frame is composed first of a sequence of discrete scan lines. As the scan lines are traversed in sequence, the time-varying video signal is a representation of the luminance of the corresponding point in the scan. The justification for the discrete frames is the unconscious reconstruction of motion by the human observer and the justification for discrete scan lines is the limited resolution of the human eye.

For the display of digitally synthesized video images such as character and graphic displays, two additional discrete approximations are made. Each scan line is composed of a sequence of discrete picture elements (pixels). Each pixel has a luminance value which in the present invention is approximated by one of a number of discrete values according to a sequence of binary digits. The justification for the discrete approximation of the pixel is the limited resolution of the eye and equates through the sampling theorem to the bandwidth limit in an analog video signal. The justification for the discrete approximation of the luminance value is the limited ability of the eye to discriminate luminance when a sufficient number of levels of approximation are employed.

According to these additional approximations, an image may be represented as an array of values, either discrete or continuous. If these values are extracted from digital storage and produced in the order and rate corresponding to the adopted scanning order and rate, these values may be converted to an analog video signal conforming to some adopted standard and the image may be displayed using a standard video monitor.

Figure 1:
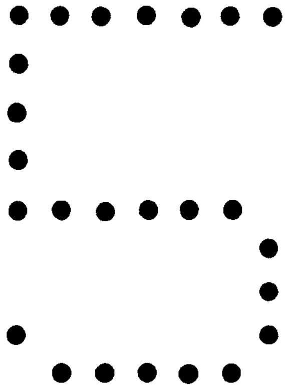
FIG. 1 is a representation of a dot-matrix character as employed in the prior art.

In prior art video terminals, the character codes to be represented on the display screen are stored in a memory in the order in which they are to be displayed, each code representing a particular character. The code is fetched from the memory in synchronism with the raster scan and causes a character generator to generate the appropriate dot signals during that raster scan as described in the above referenced Cole patent. An example of the dot matrix type character formed in such a system is illustrated in FIG. 1. If a standard video monitor is employed, as the display unit, then the video terminal must contain the appropriate character store in a video synthesizer outside of the display unit.

Figure 2:
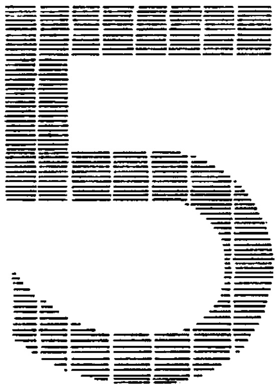
FIG. 2 is a representation of a character image as employed in the present invention.

As distinct from the dot matrix type of character of the prior art, the present invention is adapted to employ the full resolution and gray-scale of the standard video monitor. The synthetic images representing the characters to be displayed are stored outside of the standard video monitor and activate a video synthesizer to provide the appropriate signals to create an entire picture of the character during its display. An artistic rendition of a character as displayed by the present invention is illustrated in FIG. 2 for comparison with the dot matrix type character of FIG. 1.

Before generally describing the system of the present invention, the description will be provided of the nature of the character images and how they are formed. As was explained above, the present invention utilizes the full resolution and gray-scale of a standard video monitor. Thus, the character image display employs all of the picture elements in the particular character space. In the present invention, eight levels of gray-scale are employed corresponding to eight different levels of luminance which eight states can be accomodated by a three-bit number in binary code. In addition, the eight different levels are directly proportional to the luminance to be displayed rather than to the signal voltage, which is nominally the 2.2 root of the luminance. Eight discrete levels were experimently determined to be the least power-of-two number of levels sufficient to represent characters without any apparent jaggedness. More or less levels might be employed depending on the quality desired, character scale, display device, or other variables.

Figures 3A, 3B:
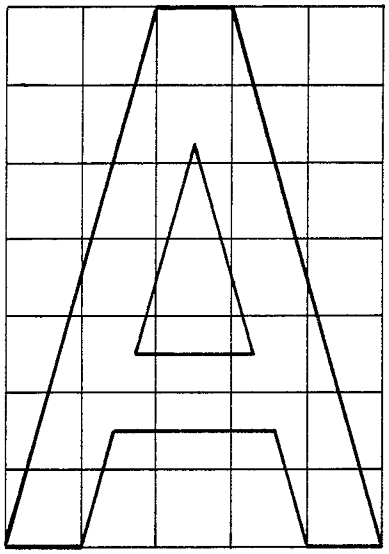
FIGS 3A and 3B are representations of the transformation of luminance values as employed in the present invention.

FIGS. 3A and 3B illustrate the manner in which the eight levels of luminance are employed in the present invention to represent a given character, in this case "A". The process by which the table of numbers is derived from the character image can be mechanized in many ways by optical and electro-optical systems. The simplest method conceptually is to digitize to eight levels the signal output of a video camera scanning the desired character at the desired scale. Unlike the dot-matrix character, which is "composed" as a table of binary values; the fully-formed character is a stored image of a symbol composed without reference to the underlying grid of picture elements. A fully-formed character font may either be designed or any existing printing or typewriter font may be employed. The individual characters are each captured and processed to form representations such as that of FIG. 3B.

Optimum results can be achieved only with great difficulty be digitizing the output of a video camera, because no camera has an ideal physical aperture. If the spot size of the camera is too small compared to the scan line spacing, the video image will contain higher spatial frequencies than sampling considerations allow. Conversely, if the spot size of the camera is too large, the effective aperture is non-isotropic depending on scanning direction, and the video image will be at too low a resolution.

In the present invention, the procedure employed is one in which the image of a character is captured at approximately ten times the resolution at which it will appear on the video display, and this high resolution image is processed digitally in order to simulate the effect of an ideal scanning aperture. Because the aperture itself is a spatial filter, the process of computing the luminance values to represent the character image limits the spatial frequencies approximately to those limits required by the sampling theorem. The proper luminance value for each picture element is computed by weighing luminance contributions from an area centered on the picture element. The weighing function is exactly like a physical aperture. The weighted sum of the luminance contributions from the area centered on the picture element whose value is to be determined is rounded to eight (or some chosen number of) levels.

There are many choices of a weighing function, or aperture, that will produce satisfactory results. A function that is unity within the picture element area, d by d, and zero elsewhere, is the simplest weighing function from the computational standpoint. Somewhat better results can be achieved by using a triangular weighing function with a base of 2d, which is equivalent to convolving the picture element aperture with itself. (Other possibilities will occur to those skilled in the art.) The displayed image shown in FIG. 3B subtends 7 scan lines with eight gray levels, and the stored image was derived from a computation based on the picture element aperture.

The images produced on a video monitor by the synthetic video signal derived from such stored character images are technically indistinguishable from those that would be produced by an ideal video camera pointed at a page of text. Accordingly, the video medium is used as it was intended to be used, and "flicker" due to excessive contrast edges with the interlaced display is absent.

The CRT spot of the video monitor employed is a physical aperture whose size and shape determine a spatial filter exactly like the abstract apertures used to compute luminances. In practice, the spot is not exactly uniform at all points in the raster, but the spot size can be adjusted generally to minimize the scan line texture, and this adjustment produces a suitable aperture for constructing the image from sampled data picture elements. It is an economically important property of the fully-formed symbol technique that the very small and consistent spot size sought for dot-matrix characters is neither necessary nor desirable. A spot in which about 75% of the energy emits from a region of diameter d is easily achieved in commercial video monitors and close to ideal for the application of the present invention.

Figure 4:
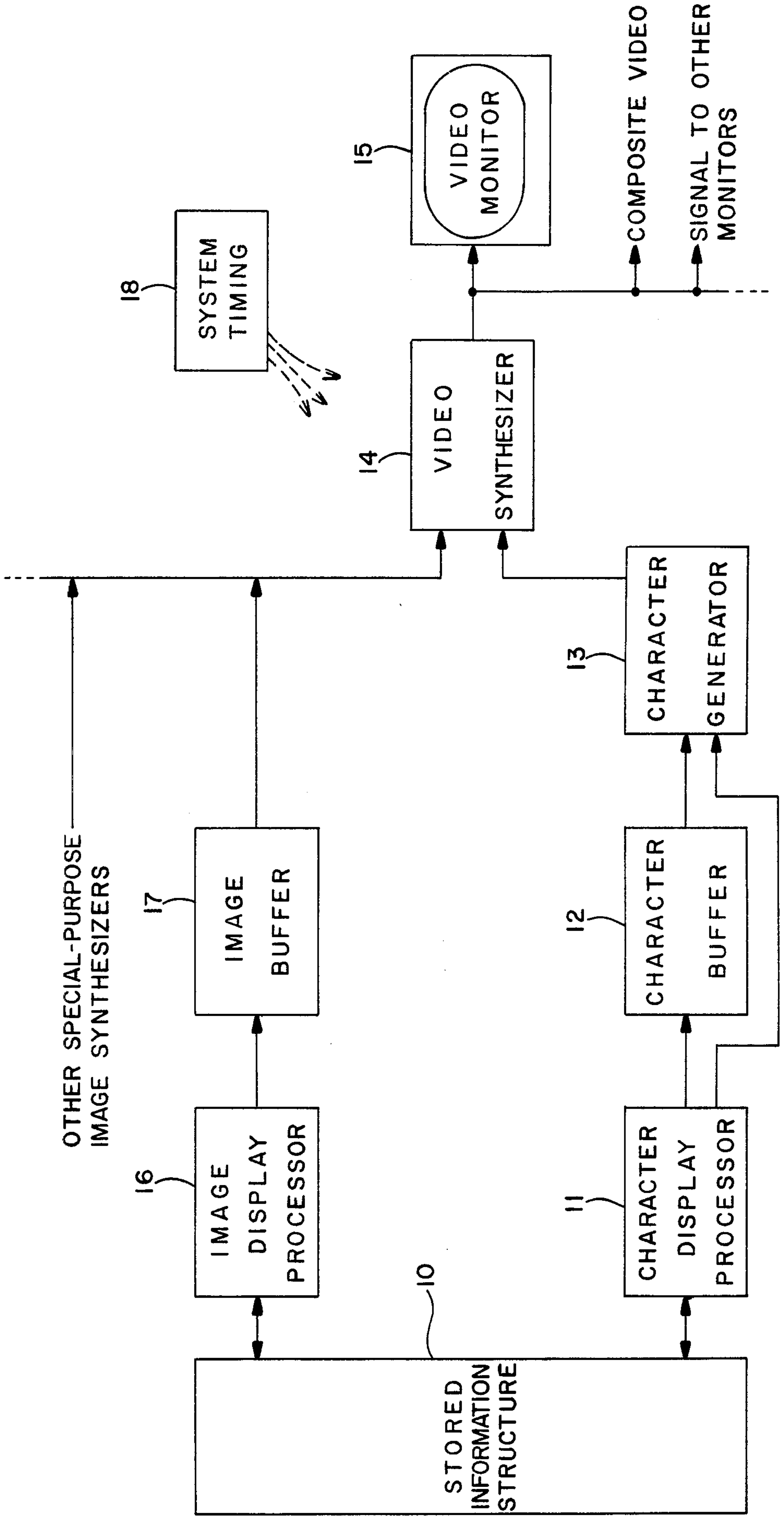
FIG. 4 is a diagram of a system employing the present invention.

The organization of a system employing the present invention is illustrated in FIG. 4. As shown therein, stored information structures are fetched from information storage 10 by character display processor 11 which basically controls the communication between storage 10 and the display system of the present invention. Character codes are transferred to character buffer 12 for reasons that will be more thoroughtly described below. Character codes then drive character generator 13 in which are stored the character font signals. These character font signals are mixed by video synthesizer 14 with other signals such as synchronization signals to provide the composite video signals supplied to standard video monitor 15. Image display processor 16 and image buffer 17 are provided in parallel with character display processor 11 and character buffer 12 when it is desired to superimpose character text upon some other image. Thus, the system of FIG. 4 accomodates modular inclusion of additional facilities as dictated by any specific application.

Video monitor 15 is the transducer which converts a composite video signal to an image that can be viewed. Because the composite video signal conforms to some standard, other video devices and systems may be used in conjunction with this signal such as video tape to store the signal, cable television or a transmitter or television receiver to convey the image to another location and various video devices to process the signal.

Video synthesizer 14 is a sampled data signal synthesizer which converts and combines the digital image specification and synchronizing signals to the single composite video signal. This hybrid digital-analog system operates from a clock and system timing unit 18 which clock corresponds to the picture element rate that in the present invention is 12.3 MHz. The derivation of the timing signals are more thoroughly described below. The cycle time of video synthesizer 14 which in the present invention is 81 nanoseconds, places a practical limit on the complexity of the functions that can be performed even though relatively high-speed logic is employed. However, the image combining operations in various modes and output conversion are pipe-lined through a series of intermediate registers containing partial results so that a very high data throughput is maintained. Because the timing cycle is typically too small for the sources of image point data, the data is typically provided with a number of image points in parallel and parallel to serial conversion is performed prior to interfacing with video synthesizer 14.

The character generator 13 contains the stored image of each character that may be displayed. It is particularly effective to organize this storage so that the image points across the scan lines are read in parallel, selected by the character code and vertical position information, and converted to serial form for input to video synthesizer 14. Either fixed or variable horizontal pitch characters may be employed.

Character buffer 12 allows the lowest data rate from the processor and consists of two or more interchangeable shift register type buffers in which the display is refreshed from one buffer while the processor fills another buffer with the next character line. Each shift register type buffer contains character code and possibly some display mode information. The refresh process generally requires multiple cycles through the buffer corresponding to the multiple sequential scan lines for each character line. The loading of the next buffer shift register should be complete by the time the display of the character line is complete so that the control of the respective shift register buffer may be switched.

Character display processor 11 is a micro-processor-based system whose primary role is to move text strings from the stored information structure of storage 10 to character buffer 12. In the implementation of the present system, display processor 11 is a programmable device which, by its power to compute and extract information from a complex information structure, assists in the formating of the text display and provides character line parameters such as the height and origin position of the character line, a mask that is useful in scrolling text smoothly, mode information, blink information and the control of the vertical synchronization.

As was indicated above, the digital video characters generated by the character display processor 11, character buffer 12 and character generator 13 may be combined in video synthesizer 14 with other digital video images. The general combining rule allows formating of the full-screen display either by text codes which key other video sources or by luminance codes which cause character or symbol display to be overlayed or superimposed.

Some of the characteristics of the system of FIG. 4 and variations therein will now be discussed. Since the video medium must be refreshed at its characteristic field and frame rate, and in raster order, the system must produce the image repetitively and in raster order. The repetitions required to refresh the display are to be at least partly independent so that changes in the information structure will be reflected immediately in the displayed image. One of the benefits of such a display system as opposed to hard copy is the ability to change the display in accordance with the users interaction.

If all of the display information is not extracted from the information structure on each frame or field, the refresh function occurs from character buffer 12, (or image buffer 17 as the case may be). In this situation, it is not important whether information is provided from display processor 11 in raster order as buffer 12 serves also to implement a scan conversion function. This variation requires a large buffer, nominally in which each buffer location corresponds to a character location or to a picture element, which buffer can be modified selectively.

If all of the display information is extracted from the information structure on each frame or field, the refresh operation may be regarded as occurring directly from the information structure. If the information provided from the display processor 11 from the information structure is necessarily uncorrelated from raster order, buffer 12 may be used to perform a scan conversion process. If the information provided from the display processor 11 from the information structure is even approximately in raster order, buffer 12 need only be a small buffer whose size depends on the most out-of-raster-order elements and speed matching considerations.

Certain types of displays of characters and symbols have very wide application and can be accomodated by raster order production, so long as the character codes are provided from display processor 11 in the order in which the characters first appear in the raster. In this case, buffer 12 will store character codes in order to repeat the character sequence across the multiple scan lines that subtend each character line. An alternative is to fetch the text sequence from the information structure repetitively.

Character and symbol display are of such wide applicability as to be required for almost any system display. For example, a system for banking applications might well include special facilities for displaying facsimiles of financial documents, signatures, or the like; but would certainly require character display for the control information related to a transaction. Similarly, engineering applications may require stylized drawings to be displayed, that will certainly require character display for legends.

DETAILED DESCRIPTION OF THE SYSTEM

Figure 5:
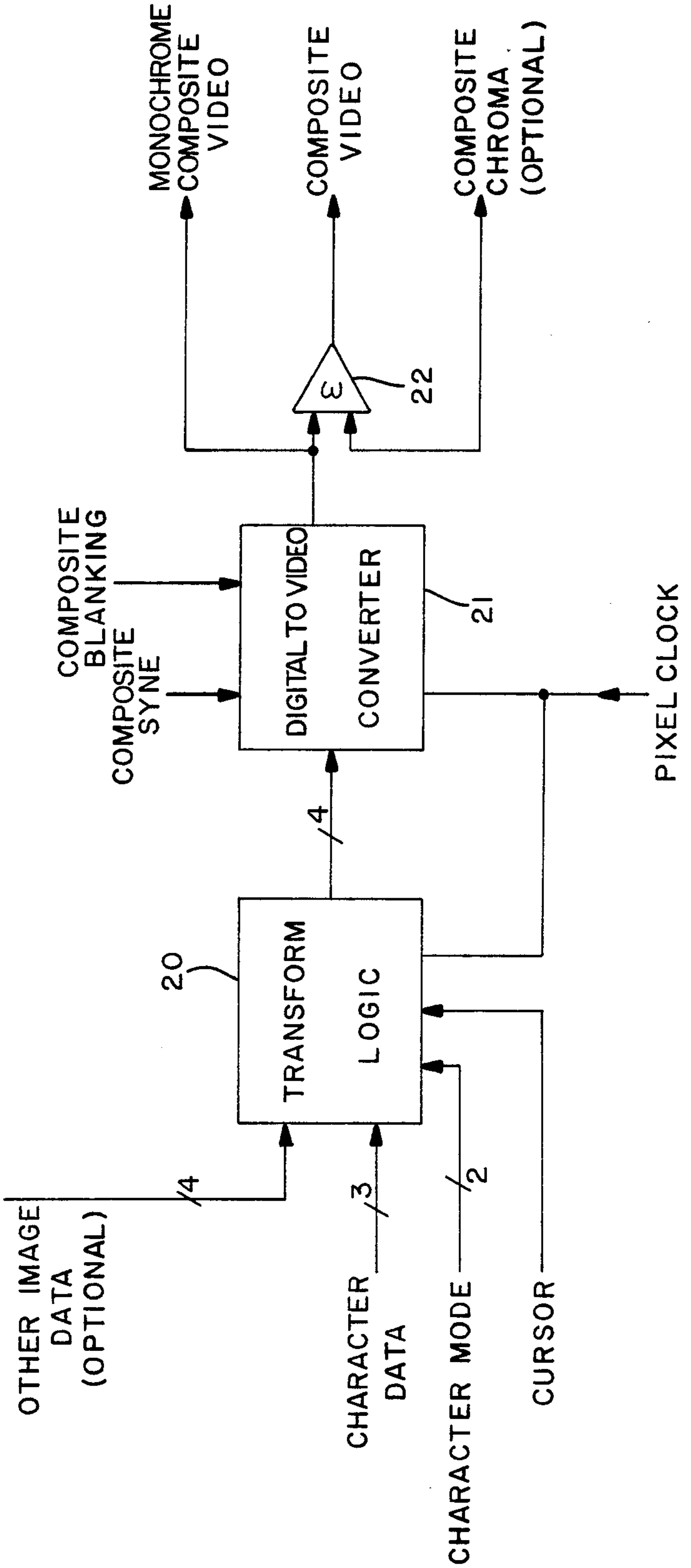
FIG. 5 is a diagram of the video synthesizer of the present invention.

Video synthesizer 14 of FIG. 4 is illustrated in FIG. 5 and includes display mode transform logic 20 which receives character data as well as the character mode signal and cursor signal for combination with other image data, which combined data is then transferred to digital-to-video converter 21 which converts the data to the analog video signal in combination with the composite sync and composite blanking signals in order to produce the composite video signal. The monochrome composite video signal produced thereby may be optionally combined at output summing amplifier 22 with a chroma signal as will be more thoroughly explained below. The synthesizer must operate entirely at the pixel clock rate with new data appearing at each clock cycle. However, this data is irrelevant during blanking periods. Data input appears one clock time early in order to allow for pipelining.

Figure 6:
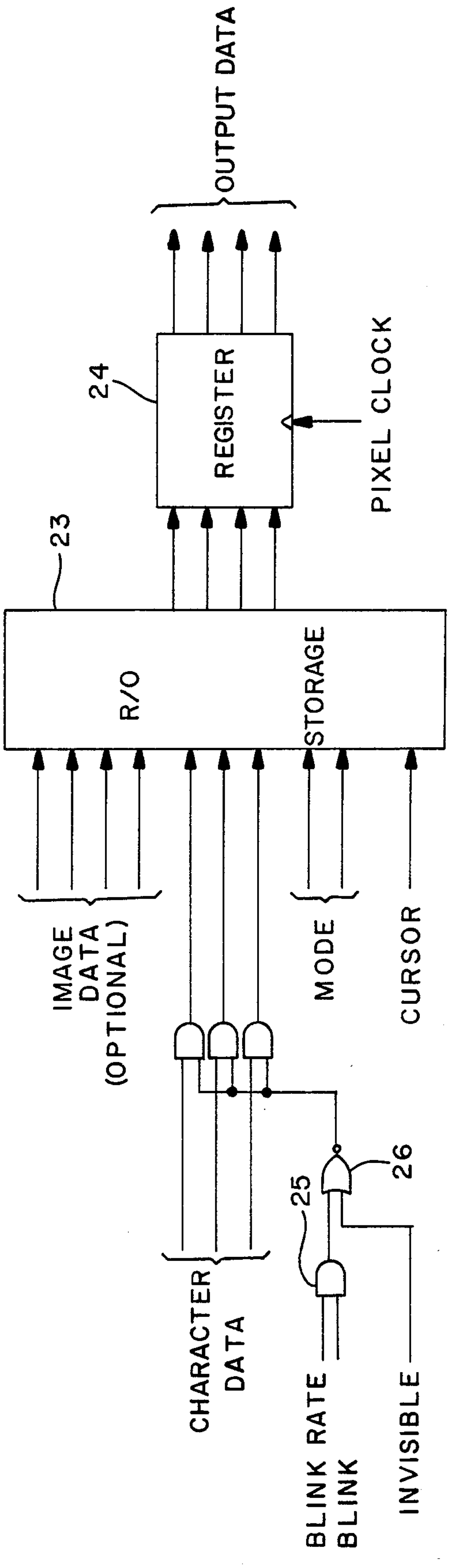
FIG. 6 is a diagram of the display mode transform logic of the present invention.

Display mode transform logis 20 of FIG. 5 is illustrated in FIG. 6 and includes read-only storage 23 that is addressed by the incoming character data, optional image data, mode signals and cursor. Read-only storage 23 serves to perform the various functions by mapping the 3-bit character data to the 4-bit output data in the various ways required. Thus, characters may be displayed in different display modes according to user preference or to highlight an area of particular interest. Text displays also benefit from a cursor which can highlight a character in a test string to indicate visually the location of the text editing operation. Typical text modes are: white-on-black, black-on-white, half-bright, white-on-gray, black-on-gray. For each of these modes it is necessary to have a contrasting cursor.

In addition, the text may be made to be invisible in order to hide classified information such as passwords. The text may also be made to blink between invisible and visible to draw attention to a particular item. This is accomplished by the receipt of blink rate and blink on signals by AND gate 25 the output of which is supplied along with the invisible signal to NOR gate 26. The output from NOR gate 26 is then "ANDED" with respective character data bits supplied to read only storage 23. Specifically, the input network consisting of AND gate 25 and NOR gate 26 treats the various cases of invisible or blinking characters by forcing the character data input to 000 when appropriate.

FIG. 7 is a table of some of the various transformations that may be accomplished by reading out a portion of the contents of read only storage 23 of FIG. 6. In this table, 15 output levels (0–14) are used in order to have a middle level of 7. The effect of the transformation is to scale the character data by either $-2$, $-1$, $+1$, or $+2$ and to offset it. This is done in order to perform the transformations readily and to use the same character data to display light-on-dark as dark-on-light which requires that the internal representation as read out of read-only storage 23 be linear to the luminance required rather than its 2.2 root and the digital-to-video converter thus must perform the gamma correction.

By use of read-only storage 23, the display mode transform logic of FIG. 6 provides for any transformation desired. It may also be used to mix digital video signals from different sources. For example, in one mode, characters can be overlayed in white on an image background. For each luminance value of the image, the character value is linearly scaled to the proportionate luminance between the image luminance and the brightest value. Similarly, mode information can be used to key the image, or particular images values can be used to key to text thus giving complete and general control over the full screening formating.

The output signals of read-out storage 23 are then supplied to register 24 from which they are then clocked at the next pixel clock time to the digital-to-video converter.

Figure 8:
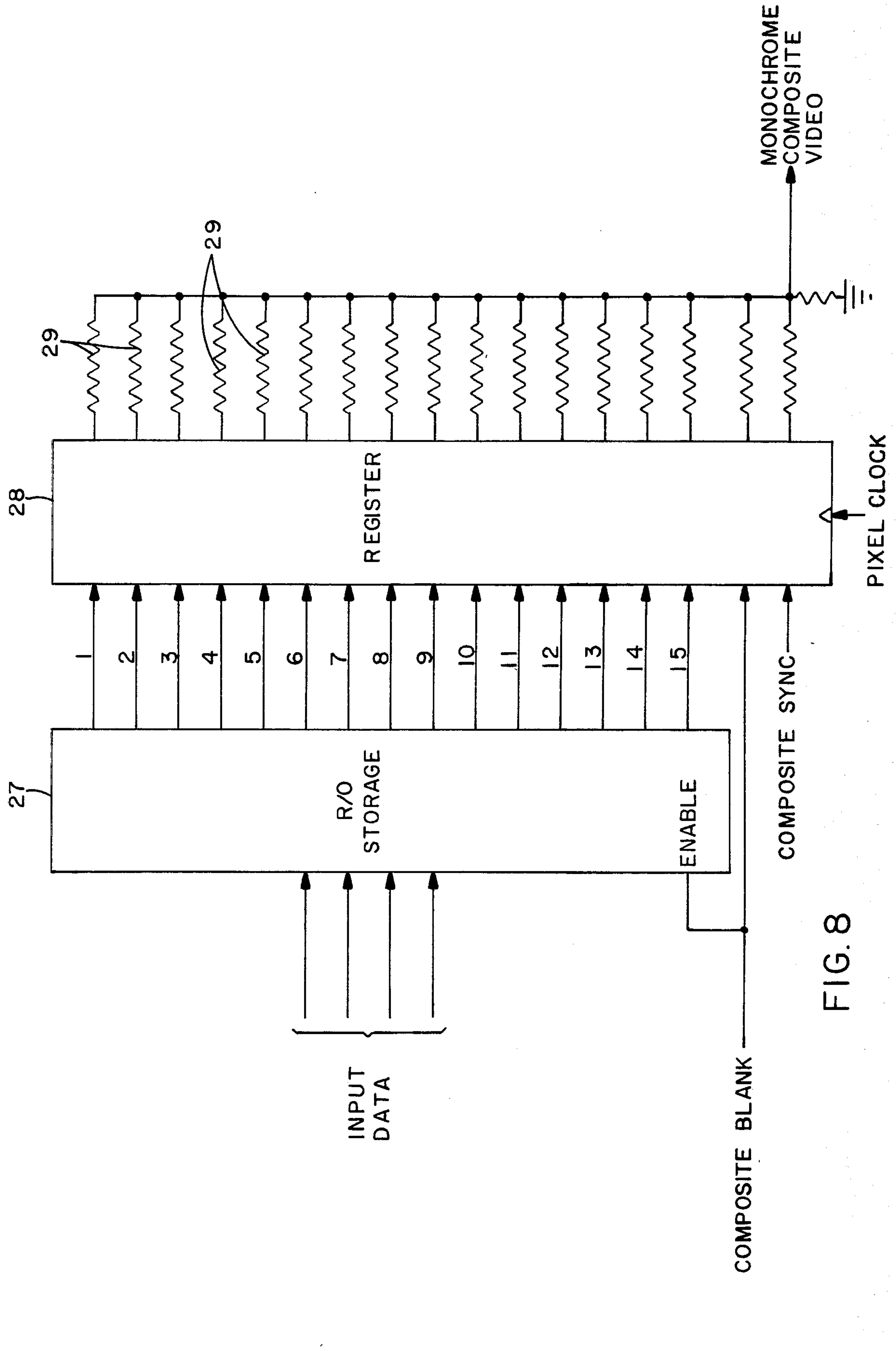
FIG. 8 is a diagram of the digital-to-video convertor of the present invention.

The digital-to-video converter 21 of FIG. 4 is illustrated in more detail in FIG. 8. This converter is a digital-to-analog converter which must be fast enough to operate at the pixel clock rate and also to have a non-linear output in order to correct for the video gamma when the data represents luminance rather than the output voltage. Furthermore, its output must be free of switching transients which are inevitable in the ladder network type digital-to-analog converter. These transients would typically occur in the transition from values such as 0111 to 1000 in which case the signals driving the resistive conversion network are changing in different directions and at slightly different times.

The binary input signals received from the transform logic of FIG. 6 are converted through a combinational mapping implemented in read only storage 27 to a unary or monadic operation code. This mapping converts four input signals to 15 different outputs in the following manner. The input 0000 produces an output of all zeros. The input 0001 causes just the first of the fifteen outputs to become 1. The input 0010 causes the first two of the fifteen outputs to become 1, and so on until the input 1111 causes all fifteen output to be 1. This code has the property that the transition between any two input combinations can only cause a group of adjacent outputs to change in the same direction. Thus, when these outputs are weighted and summed through resistive network, after being reclocked, the analog output changes monotonically from one value to another without switching transients.

The resistance network is illustrated in FIG. 8 as being formed of the plurality of resistors 29 which are of appropriately varying resistance values. The 16 output levels produced thereby are spaced by 15 steps, and the conductances of each of the fifteen weighting resistors 29 is proportional to the size of that step. If all of the conductance were the same, the output would be linear with the data input. However, any positive monotonic non-linear function can be produced just as easily by making each conductance proportional to the corresponding step size. Thus, the resistance values may be calculated to achieve correction for whatever value of gamma is expected.

As has been indicated above, the voltage representation of luminance in a video signal is not linear. Instead, according to U.S. Standards, luminance is approximately the 2.2 power of the voltage. Conversely, the voltage is approximately 1/2.2 power (2.2 root) of the luminance. In FIG. 8, the values of the respected resistances 29 are calculated accordingly.

The advantages of having voltage output as the 2.2 root of luminance is that it allows the transmitter to compensate for a non-linearity inherit in the receiver monitor. Secondly, the root function, being a good approximation of the logarithmic response of the eye, has the advantage that noise of particular amplitude has approximately the same subjective effect when superimposed on dark and light areas. If a linear relationship existed between luminance and voltage, noise voltage would be more evident in the dark display than in the light areas of the image. This technique also greatly simplifies the computational transformation in regard to scaling, rotation, and arbitrary positioning of synthetic figures.

Another advantage of this type of converter resistance values is that the resistance values need only be as precise as the steps size dictates. Typically 5% resistance tolerances will be more than adequate. The switches likewise need not be particularly precise. In fact, the flip flop outputs of register 28 will generally serve as voltage sources to drive the weighting and summing networks. Accordingly, the converter is easily made fast.

In general, the conversion techniques discussed above uses more components than the ladder network type of converter. However, components of much lower precision can be employed and the present conversion technique is well suited for integrated circuit implementation. The composite sync and blanking signals are weighted into the summing network in the same way as the data. In addition, the presence of the blanking signal gates the data input to 0 in order to reject any spurious information on the data input during blanking periods.

Figure 9:
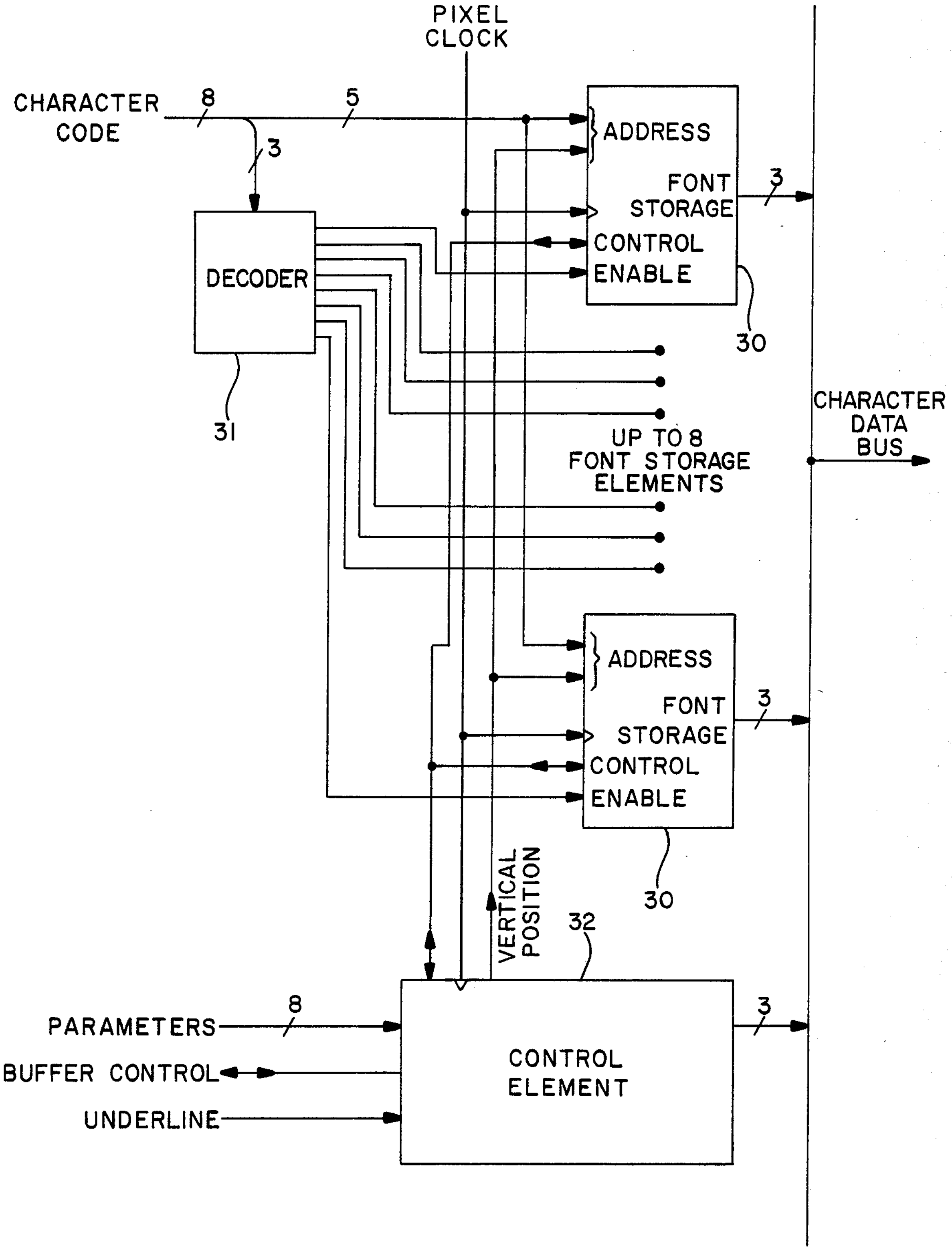
FIG. 9 is a diagram of the character generator of the present invention.

Character generator 13 of FIG. 4 is illustrated in more detail in FIG. 9. This generator includes, for illustration, from 1 to 8 font storage elements 30 where each storage element stores the image of 32 characters for a total of 256 possible characters. The generator also includes decoder 31 to select one font storage element according to the incoming character code and control element 32 that will be more thoroughly described below.

Figure 10:
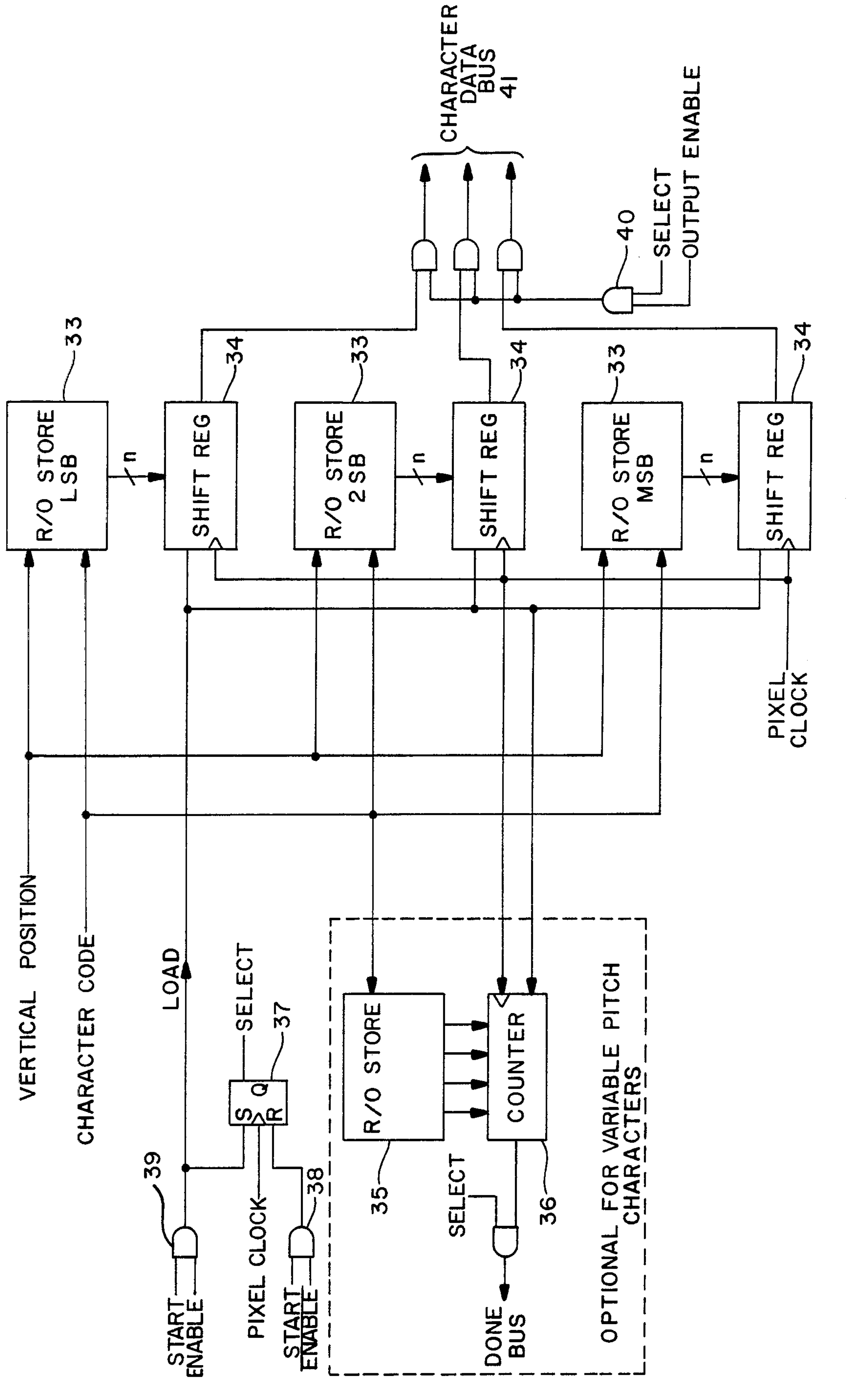
FIG. 10 is a diagram of a font storage element as employed in the present invention.

The various font storage elements 30 of FIG. 9 are shown in more detail in FIG. 10. A digital video character is produced on character data bus 41 in response to the receipt of the character code and vertical position data. This information together forms the address to the respective read-only storage elements 33. The image data for each character has been computed by techniques explained above and this data stored in the three similar read-only storage sections 33 by the usual mask process. It will be understood that read-write storages may be employed with provision for loading the contents from the character display processor of FIG. 4. When a load signal is produced by AND gate 39 of FIG. 10, the data from respective read-only storage elements 33 are transferred synchronously into their corresponding shift registers 34 from where they are read out in a serial digital video data sequence to the video synthesizer 14 of FIG. 4 as was described above.

The appearance of a start signal to an enabled storage element also sets the internal select flip flop 37 and the storage element will remain selected until another start signal is received with enable logical zero. The signal input to the parallel to serial conversion shift registers 34 is a logical zero and the selected storage element will simply output zeros to the character data bus 41 after the prescribed number of picture elements have been produced from the corresponding storage element. In addition, the control may disable the output at times in order to overlay an underline, crossout text, or cursor symbol.

For variable-pitch characters, it is most natural to store the character width in the same element as the character image. For variable pitch characters, optional read-only storage element 35 may be employed which contains 32 four-bit words which are masked to contain the character width as a prescribed number of picture elements. In this case, when an enabled element is started, the width of the selected character is transferred synchronously into a binary down counter 36 and the underflow signal from this counter is gated onto a bus line which returns to the control to indicate the completion of the current character.

Figure 11:
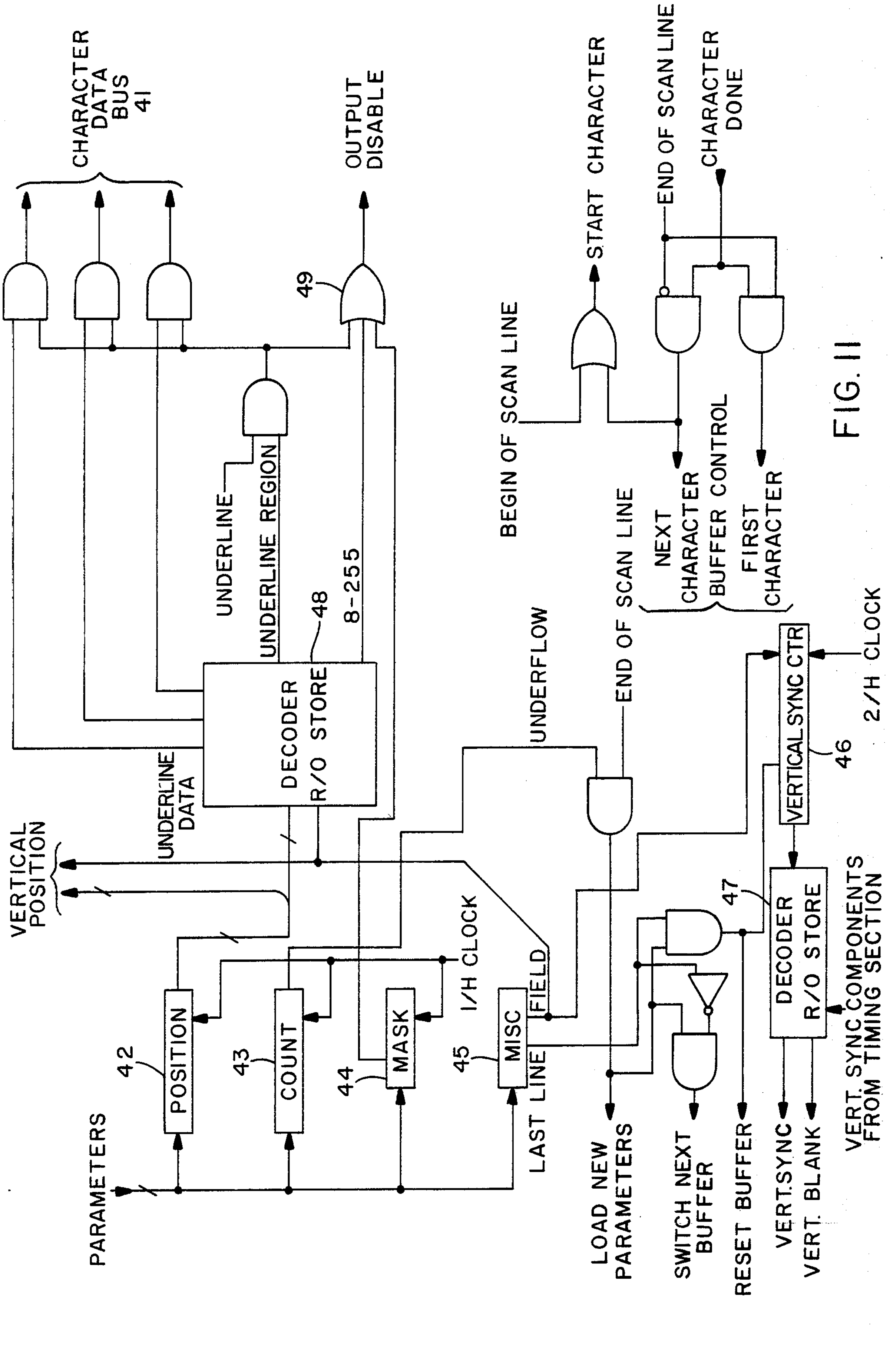
FIG. 11 is a diagram of the control element logic of the present invention.

Control element 32 of FIG. 9 is illustrated in more detail in FIG. 11. The control element receives the parameters required to control such features as vertical format slow scrolling, underlining, or crossout text. To this end, initial position and count parameters are received respectively by counting registers 42 and 43.

Mask counter 44 receives the mask parameter. These registers are driven by a systems clock. The function of these parameters will be more thoroughly described below. In addition, the control element is provided with a decoder read-only store 48 which contains the data for underlining such as required. The last line and field parameters from miscellaneous register 45 are used to control vertical sync counter 46 that drives decoder read-only store 47 to supply a vertical sync and vertical blinking signals.

Slow scrolling, positioning and spacing of the text within any scan line pair will now be described. The stored image is placed within a larger address space as illustrated graphically in FIG. 12. The addresses are allowed to "wrap around", i.e., modulus 256. For this reason, the address space is referred to as the "character wheel". Because of the interlaced scan, the lowest-order binary digit of the address to the character wheel is the signal called FIELD and this indicates whether the upper or lower scan line in the address scan line pair is used for display.

Figure 12:
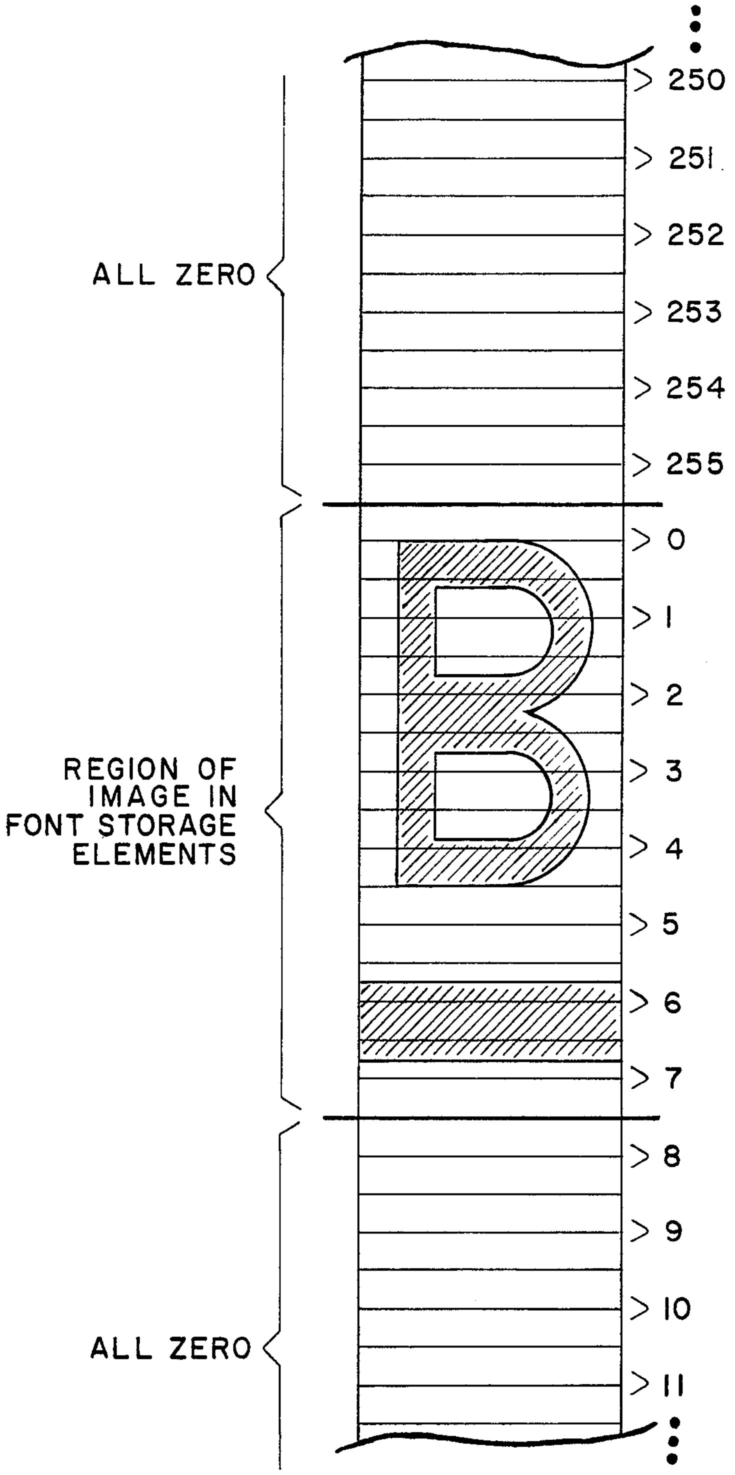
FIG. 12 is a representation of the "character wheel" of the present invention.

The manner in which slow scrolling or smooth scrolling is achieved will now be more specifically described in relation to FIGS. 11 and 12. The location of the character in the character wheel of FIG. 12 is defined by the three parameters supplied to the control element of FIG. 11. As indicated above, these parameters are the initial position, the count and the mask. These parameters are loaded into the respective registers of the control element at the beginning of each character line. By adjusting these parameters, the initial scan lines of the character line can be deleted with the remaining scan lines automatically moving up with additional scan lines being added at the bottom of the character space and the character appears to move up. Similarly, the characters can be made to appear to move or scroll downwardly.

The function of the mask parameter is to mask out all portions of the character wheel except that portion being displayed which, in the case of FIG. 12 is each scan line pairs 0–7. Thus, as the character is moved upwardly in the character line, it will appear to disappear behind the barrier. At the same time, in the previous character line, a different character wheel employed therefor as defined by its own parameters will give the appearance of the character moving up from behind the barrier. Thus, the character can be made to appear to slowly move upward from character line to character line in a very smooth fashion. Conversely, the character can be made to appear to move downward in the same slow smooth manner. This is accomplished because position register 42, count register 43, and mask register 44 are loaded at the beginning of each character line with the actual location of the character line being determined by character display processor 11 of FIG. 4 which fetches the respective character codes and their corresponding parameters from storage 10 in a continuous manner. Thus, there is no need to have another counter in the system to count out vertical synchronization since it is the number of times per field that the parameter registers are loaded that determines how many character lines there are plus one more to do the vertical synchronization.

In FIG. 11, mask register 44 need only contain 4-bits for the individual 15 scan lines of the 8 scan line pairs which make up the character frame. There is no harm in the mask parameter being periodic modulus 16. When the high order bit of the mask is zero, it allows the character to be visible through the mask. When the high order bit is one, the character is invisible as this causes an output disable signal to be generated as indicated in FIG. 11.

Slow, smooth scrolling can be achieved without use of the mask register and operation by manipulation only of the initial values of the position and count registers at the first and last character lines in a scrolling segment. However, it is possible in this case to display only a single or very small number of scan lines in a contracting character line, and the small number of scan lines may consume so short a period of time that the processor may be unable to complete filling the next character buffer before it is required for display. Accordingly, if smooth scrolling is to be performed without use of the mask register, the character buffer must have the capacity to store three or more character lines, and the processor must be able to replenish this speed-matching buffer more rapidly than display depletes the buffer.

As was indicated above, the two fundamental parameters which control the format of the display are the initial position on the character wheel and the count of the number of scan lines to be produced. For example, starting at address zero with a count of eight scan lines will result in the character lines being spaced vertically by their normal minimum separation analogous to single spacing on a typewriter. Starting at address 252 with a count of 16 display lines, lines 252 through line 11, is similar to double-spaced typing. Display of lines 254 through line 9 with a count of 12 scan line pairs along the character wheel is similar to one-and-one-half spacing on a typewriter.

The same functional mechanism is employed to provide a program-controlled vertical synchronization. For example, 480 of 483 possible visible scan lines for text display might be employed in a format in which 240 scan line pairs are used to produce 30 lines of single spaced text with a count parameter of eight. The vertical synchronization intervals will consist of either 22 or 23 scan lines depending upon which field is completed. In this vertical synchronization mode, the display is blanked (vertical blanking) and the vertical synchronization signal characteristic of the particular video standard is produced beginning either one or two half scan lines later depending on the field completed.

This technique avoids the necessity of having a scan line counter and yet allows program-controlled vertical synchronization to accommodate, with the same instrument, the multiple scan standards employed.

In the operation of the character generator control, the control element receives directly from the display processor, the initial value and count parameters stored in the respective counting registers 42 and 43 and supplies vertical position information to the respective font storage elements 30 of FIG. 9. Control element 32 of that figure detects when the character wheel address is within the active segment, nominally position 0–7 of the character wheel and initiates each character and advances the character line buffer one position for the next character. The control element also receives the control bits for FIELD and LAST LINE which indicates that the next character line is the vertical synchronization interval.

When the control element is to perform the underline function or crossout text function, these functions are produced by decoding the vertical position, disabling the font storage output and inserting data on the character data bus. A full bright scan line with half-bright scan lines on either side produces very good underlining or crossout which does not flicker. The respective font storage elements are activated even when their outputs are not used in order to determine the character width in the variable-width case.

The mask parameter supplied to mask counter 44 of FIG. 11 is 4 bits for the scale of characters employed in the present invention. Whenever the high-order bit of this parameter is zero (the register counts are 0–7) display occurs as usual. When the high-order bit is one (the register contents are 8–15) and the effect is the same as if the character wheel were in positions 8–255 and the display is masked. If the mask parameter was the same as the four low-order bits of the initial position on the character wheel, the display would not be masked. However, if the mask parameter were 12 and the initial position were zero, the first four scan lines of the character line display would be masked.

The timing system employed in the present invention will now be described which system employs U.S. broadcast or close-circuit standard video, the parameters of which are described in the Electronic Industries Association Standards RS-170 and RS-330. The report of the National Television Standards Committee (NTSC) is the basic standard applicable to color systems used in the United States. While the present invention is not adapted as a color system, the features involved can be employed in such a system.

Digital systems such as employed with the present invention can be adapted to different standards by parametric variation without any change in the basic structure of the system. Such changes require only variations in such parameters as the modulus of the counter, the function produced by the combinatorial network and the frequency of the particular oscillator. As an example of easily accommodated difference in standards, U.S. standards have 525 scan lines per frame and a frame rate of 30 Hz, while the British standards have 625 scan lines per frame and a frame rate of 25 Hz. This difference is explained by the predominance of 60 Hz. A.C. power in the United States and 50 Hz power in England. The number of scan lines produced per second (15,750 in the United States and 15,625 in England) is similar enough that even the same monitors can often be used with either standard by adjustment only of the vertical synchronization and size.

For the digital production of video signals, the following analysis is provided based on the U.S. Standards. There are 525 scan lines per frame, but which typically 483 are visible and the remaining 42 used for vertical synchronization and the required vertical retrace time. The scan lines are horizontal from left to right and the horizontal/vertical aspect ratio of the visible image is 4/3. A square geometry coordinate system, in which the picture elements are spaced horizontally at the same pitch as the scan lines are spaced vertically, is desirable both to equalize horizontal and vertical resolution and to simplify digital computation of the coordinate. Thus, the best choice of the number of picture elements along each scan line is $(4/3)\times 483=644$ picture elements per scan line. The active picture information portion of the scan is 33/40ths of the time H allowed for each scan, and the time P for each picture element is approximately 1/780ths of the scan line time. In the present invention, the picture element oscillator is approximately 12.27 MHz. If optional color timing is provided, the color oscillator is at a frequency of approximately 14.32 MHz.

Figure 13:
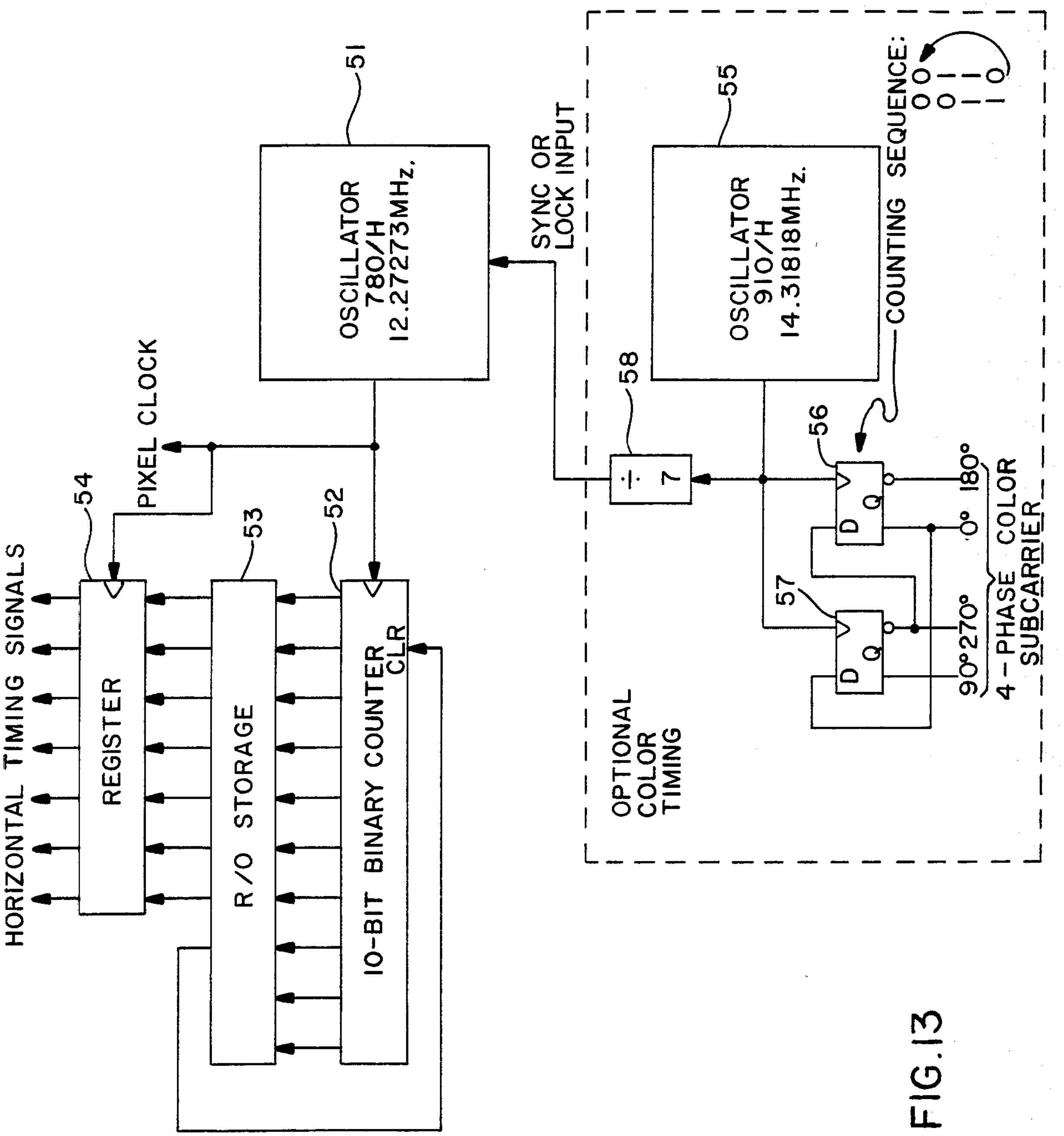
FIG. 13 is a schematic diagram of the timing system of the present invention.

The system timing generator is illustrated in FIG. 13. As shown therein, the picture element clock 51 drives a 10-bit binary counter 52 whose outputs are mapped through read-only storage device 53. The counter contents 779 through 1023 cause one output of the read-only storage device to become a logical one, so that when connected back to the synchronous clear input of counter 52, it causes the count of modulus 780. Various other conditions in the counting sequence from 0 to 779 are mapped through read-only storage 53 and clocked into register 54 in order to produce timing indications of points in the horizontal scan. These include the horizontal synchronization pulse, horizontal blanking to define the active video area and the color burst gate. All of these signals are constitutents of the composite video signal. One other signal (HPIX-n) changes from logical 0 to logical 1 n clock periods before the beginning of the active video period and changes from a logical 1 to a logical 0 n clock periods before the end of the active video period so as to allow a sufficient number of clock steps in advance to start and stop the flow of digital video information through the sequence of intermediate registers described above in a pipeline fashion. Vertical synchronization, blanking and the active video area are controlled by display processor 11 of FIG. 4. The system timing generator of FIG. 13 goes no further than a frequency division to 1/H.

Combinatorial mapping is indicated here as implemented in a read-only storage device 53. However, a gate network that produces the same set of functions of the given input address lines would serve as well. For a different video standard, the structure of FIG. 13 would remain the same, except only the oscillator frequency and the contents of read-only storage device 53 would be different.

Also shown in FIG. 13 is an optional timing system for a color system. The output of oscillator 55 is divided by a modulus-4 Gray code counter 56 and 57 in order to produce a 4-phase color subcarrier. Division of the output of oscillator 55 by 7 in divider 58 can be employed to synchronize or lock each sixth cycle of the main picture element oscillator 51.

EPILOGUE

A digital video display system has been described wherein the various characters to be displayed are displayed in the form of images of the complete character rather than the standard dot-matrix pattern of the prior art. A character generator in the display system stores signals representing the various characters to be displayed which are retrieved from storage in response to a character code. The signals are in the form of a binary code having a sufficient number of bits to represent a different number of levels of gray-scale or luminance values for the various picture elements making up the character image.

The binary codes retrieved from storage are supplied to a video synthesizer that generates the video signal to display the character images which may be displayed in a number of different modes including white-on-black, black-on-white, black-on-gray, and white-on-gray as well as different combinations of such modes to represent a cursor. The video synthesizer can generate output voltage levels in discrete steps for the different luminances to be employed. The voltage output signals differ from level to level in accordance with the 2.2 root of luminance.

The display system is also provided with a control element that includes position and count registers to specify the initial position of a scan line and the number of scan lines displayed which registers are supplied with incoming data to specify the position of each character line so that the position of a character image on display can be adjusted upwardly or downwardly to give the appearance of smooth scrolling.

While but one embodiment has been disclosed it will be apparent to those skilled in the art that changes and modifications can be made therein without departing from the spirit and scope of the invention as claimed.

What is claimed is:

1. A video synthesizer for a digital video display system, said video synthesizer comprising:

a summing network to provide in sequence a plurality of different output voltage levels which levels are selected from three or more such levels to designate different luminance values to be displayed, said summing network having a plurality of different input leads, said summing network including a plurality of resistances coupled between said respective input leads and a common connection, said resistances having different resistance values to provide to said common connection different voltage levels which increase proportionately to a root of the luminance to be displayed;

a storage device having a plurality of output leads coupled to respective ones of said summing network input leads, said storage device storing different monotonic operation codes to activate different combinations of said input leads such that an increase or decrease in the output voltage level only results from a corresponding increase or decrease respectively in the number of said input leads to be activated, and means coupled to said storage device to transmit a binary code to said storage device which binary code designates a monotonic operation code to select the particular luminance to be displayed.

2. A synthesizer according to claim 1 wherein:

said summing network includes a plurality of resistances coupled between said respective input leads and a common connection to provide to said common connection different voltage levels which increase proportionately to the 2.2 root of luminance to be displayed.

3. A synthesizer according to claim 2 wherein said binary code is transmitted in parallel and has a number of bits which number is the least power of 2 required to represent the different luminance levels to be displayed and wherein:

the number of output leads from said storage device is greater than said least power of 2 so as to allow said binary code to select more than one luminance level to be displayed.

4. A video synthesizer according to claim 1 further including:

a register coupled between the output leads of said storage device and the input leads to said summing network to receive said monotonic code prior to activation of the summing network.

5. A video synthesizer according to claim 4 further including:

clock means coupled to said register to activate said summing network one clock time after receipt of the monotonic code by said register.

* * * * *